US012361991B2

(12) United States Patent
Katoch

(10) Patent No.: US 12,361,991 B2
(45) Date of Patent: *Jul. 15, 2025

(54) FAR END DRIVER FOR MEMORY CLOCK

(71) Applicant: Taiwan Semiconductor Manufacturing Company, Ltd., Hsinchu (TW)

(72) Inventor: Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,338

(22) Filed: May 10, 2024

(65) Prior Publication Data

US 2024/0290366 A1    Aug. 29, 2024

Related U.S. Application Data

(63) Continuation of application No. 17/571,670, filed on Jan. 10, 2022, now Pat. No. 12,009,055.
(Continued)

(51) Int. Cl.
*G11C 7/22*        (2006.01)
*G11C 11/4076*   (2006.01)
(Continued)

(52) U.S. Cl.
CPC .......... *G11C 7/222* (2013.01); *G11C 11/4076* (2013.01); *G11C 11/4085* (2013.01);
(Continued)

(58) Field of Classification Search
CPC . G11C 7/222; G11C 11/4076; G11C 11/4085; G11C 11/4087; G11C 11/418;
(Continued)

(56) References Cited

U.S. PATENT DOCUMENTS 6,760,857 B1    7/2004  Lau et al.
10,586,006 B2   3/2020  Sann et al.
(Continued)

FOREIGN PATENT DOCUMENTS

CN    111798891 A    10/2020

OTHER PUBLICATIONS

Taiwanese Office Action; Application No. 111112712; Dated Jul. 8, 2022.
(Continued)

*Primary Examiner* — Sultana Begum
(74) *Attorney, Agent, or Firm* — Jones Day

(57) ABSTRACT

Memory clock drivers, memories, and methods of operating memory clock drivers are provided. A memory device contains two memory clock drivers disposed opposite each other across an array of rows of memory cells. The memory clock drivers contain decoders, which decode an address corresponding to one or more rows of memory cells. The decoders are configured to decode the address to provide a plurality of word line signals to the corresponding rows of memory cells. The memory device also includes a row select circuit, which receives a row select address and activates a corresponding row of memory cells. The memory device includes control circuitry to control the arrays of memory cells at a local and a global level, as well as I/O modules to send signals to different parts of the memory device and integrate the memory device into external devices.

20 Claims, 10 Drawing Sheets

Related U.S. Application Data

(60) Provisional application No. 63/195,835, filed on Jun. 2, 2021, provisional application No. 63/175,587, filed on Apr. 16, 2021.

(51) Int. Cl.
*G11C 11/408* (2006.01)
*G11C 11/418* (2006.01)
*H03K 19/20* (2006.01)

(52) U.S. Cl.
CPC ........ *G11C 11/4087* (2013.01); *G11C 11/418* (2013.01); *H03K 19/20* (2013.01)

(58) Field of Classification Search
CPC ....... G11C 11/417; G11C 5/025; G11C 5/063; G11C 8/08; G11C 8/10; G11C 8/18; G11C 8/12; H03K 19/20
See application file for complete search history.

(56) References Cited

U.S. PATENT DOCUMENTS

| | | | |
|---|---|---|---|
| 10,896,720 | B2 | 1/2021 | Morishige |
| 11,295,805 | B2 | 4/2022 | O et al. |
| 2009/0128465 | A1 | 5/2009 | Sugimoto et al. |
| 2011/0149629 | A1* | 6/2011 | Shim .................. G11C 16/04 365/230.03 |
| 2020/0312400 | A1 | 10/2020 | Tsukihashi |
| 2021/0104269 | A1 | 4/2021 | Yatsushiro et al. |

OTHER PUBLICATIONS

Chinese Office Action; Application No. 202210375151.X; Dated May 30, 2025.

* cited by examiner

FAR END DRIVER FOR MEMORY CLOCK

CROSS-REFERENCE TO RELATED APPLICATIONS

This is a continuation application of U.S. patent application Ser. No. 17/571,670 filed Jan. 10, 2022, which claims priority to U.S. Provisional Patent Applications No. 63/175,587 filed Apr. 16, 2021, and 63/195,835 filed Jun. 2, 2021, which are incorporated herein by reference in their entireties.

BACKGROUND

Memory devices are used to store data, typically stored in an array of rows and columns. A memory device receives an address of data to be accessed, and the memory device uses that address to activate portions of that array to access the requested data. In some memory devices, a row of the memory device is activated via a clock addressed to the row of memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
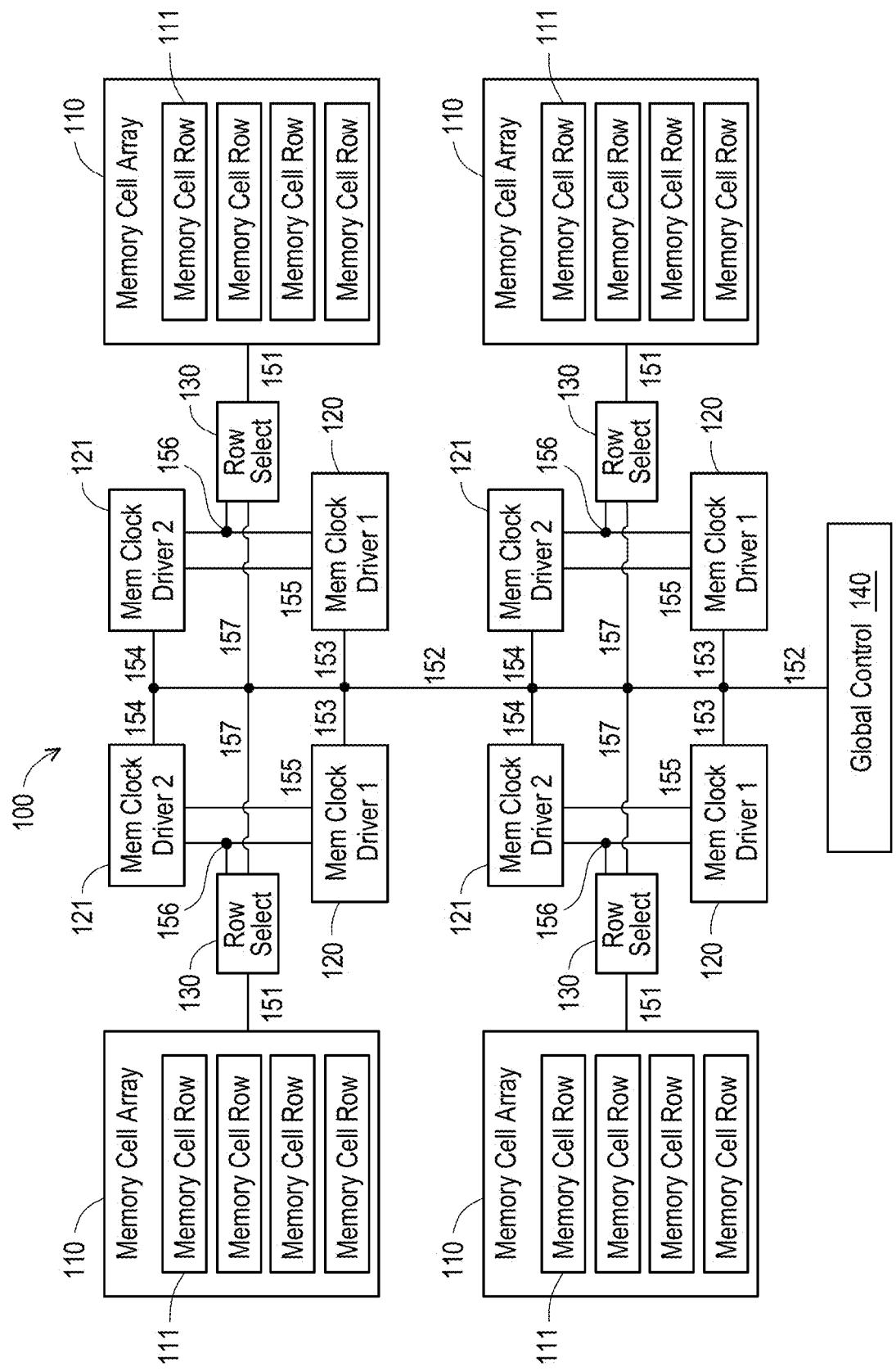
FIG. 1 is a block diagram depicting a memory device including multiple arrays of memory cells, each with two memory clock drivers disposed opposite each other, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor memory may comprise at least one two-dimensional memory cell array, where information is stored. Word lines may be configured to select rows of the memory cell array to activate cells and bit lines select columns, which access (i.e., read to or write from) the cells. When a word line and a bit line are activated, a particular memory cell connected to them is selected.

To activate a word line, its voltage is normally set to a high voltage, which is equal to a positive supply voltage in complimentary-metal-oxide-semiconductor (CMOS) circuitry. Setting a word line to a low voltage, which is a voltage complimentary to the positive supply voltage, de-activates the word line. While the low voltage is customarily set to ground, or 0 V, the value for the high voltage can be different for various semiconductor manufacturing technologies. For instance, in a deep-sub-micron technology, a high voltage can be 1.2 V or even lower, while in a sub-micron technology the high voltage can be 2.5 V. But for a given memory chip and a given technology, the high voltage is normally designed to a fixed value, and this is particularly true for CMOS memory circuitry.

A memory clock is typically used to time activation of a number of word lines in the memory device. Certain implementations of word line driver circuits in memory devices utilize a single memory clock driver to select and drive specific rows of memory cells in a memory array. Such approaches making use of a single memory clock driver are susceptible to timing issues such as time contamination delay in the signal produced by the memory clock driver. Contamination delay occurs in digital circuits when an input is changed and a corresponding change in an output value lags behind the change in input as the changed input value propagates through a component or portion of a circuit. Contamination delay is particularly problematic for high speed applications, including computing and memory applications because the delay may cause unexpected error if an expected output value is not achieved in time for an event. In memory circuits driven by a single memory clock driver, this may result in word lines being activated or driven near the memory clock driver before word lines relatively far from the memory clock driver. This may result in less than all of the intended rows of memory cells being updated with a correct set of information at a correct time. Otherwise, to ensure such errors are avoided, the circuit may need to operate at a lower speed to allow time for an output state to change while experiencing contamination delay. In such a case, the time delay becomes a limiting factor for the speed at which the circuit can be safely operated. Neither of these scenarios are ideal for memory devices, in which both accuracy and speed are critical.

In the case of memory devices implemented with a single memory clock driver, contamination delay occurs in the memory clock signal when the memory clock driver changes state to activate or deactivate specific rows of memory cells and the change in voltage takes a finite amount of time to propagate across the length of the word line. Therefore, the magnitude of contamination delay and the error risk associated with it are greatest at an end of the word line furthest away from the memory clock driver, where the change in signal on the word line produced by the memory clock driver takes the longest to reach. In a high speed circuit, this may result in a desired row of memory cells not being activated in time to store information, resulting in an error. Alternatively, as previously described, the circuit's speed may need to be slowed down to prevent such errors.

Certain embodiments described herein may alleviate the risk of contamination through the implementation of a second memory clock driver at an opposite end of a memory clock line from a first memory clock driver. In this configuration, the two memory clock drivers pull both sides of the memory clock line to the desired voltage, eliminating the contamination delay associated with a voltage change propagating across the memory clock line to the end of the memory clock line across from a single memory clock driver.

FIG. 1 is a block diagram depicting a memory device 100 including multiple arrays of memory cells 110, each with two memory clock drivers 120 and 121 disposed opposite each other, in accordance with some embodiments. Each array of memory cells 110 contains a plurality of memory cell rows 111 and is electrically coupled to a corresponding row selection circuit 130, which activates and selects a memory cell row 111 by transmitting a local control output signal 151 to the memory cell row 111 to be selected.

In embodiments, a global control circuit 140 provides a main control of the memory device 100. The global control 140 generates appropriate internal signals to perform requested operations in the memory device 100 and outputs the signals as global control output 152. In some embodiments, the global control 140 receives inputs from the outside world (e.g., chip-level inputs), which it uses to generate the global control output 152.

The memory clock drivers 120, 121 and the row selection circuits 130 are electrically coupled to the global control output 152. At 153 and 154, the memory clock drivers 120, 121 receive a first address of a memory cell row 111 and to be driven. In some embodiments, the memory clock drivers 120, 121 also receive a master clock signal at 153 and 154, respectively. In some embodiments, the memory clock driver 120 receives a master clock signal at 153 and the memory clock driver 120 transmits the master clock signal at 155 to the memory clock driver 121, which does not receive a master clock signal at 154. The memory clock drivers 120, 121 decode the first address received at 153 and 154 and drive the word line clock corresponding to the first address at 156, which is input to the row selection circuit 130. At 157, the row selection circuit 130 receives a row select address for the row selection circuit 130 to select a corresponding memory cell row 111. The row selection circuit 130 then drives and selects the appropriate row 111 based on the inputs it received at 156 and 157.

Figure 2:
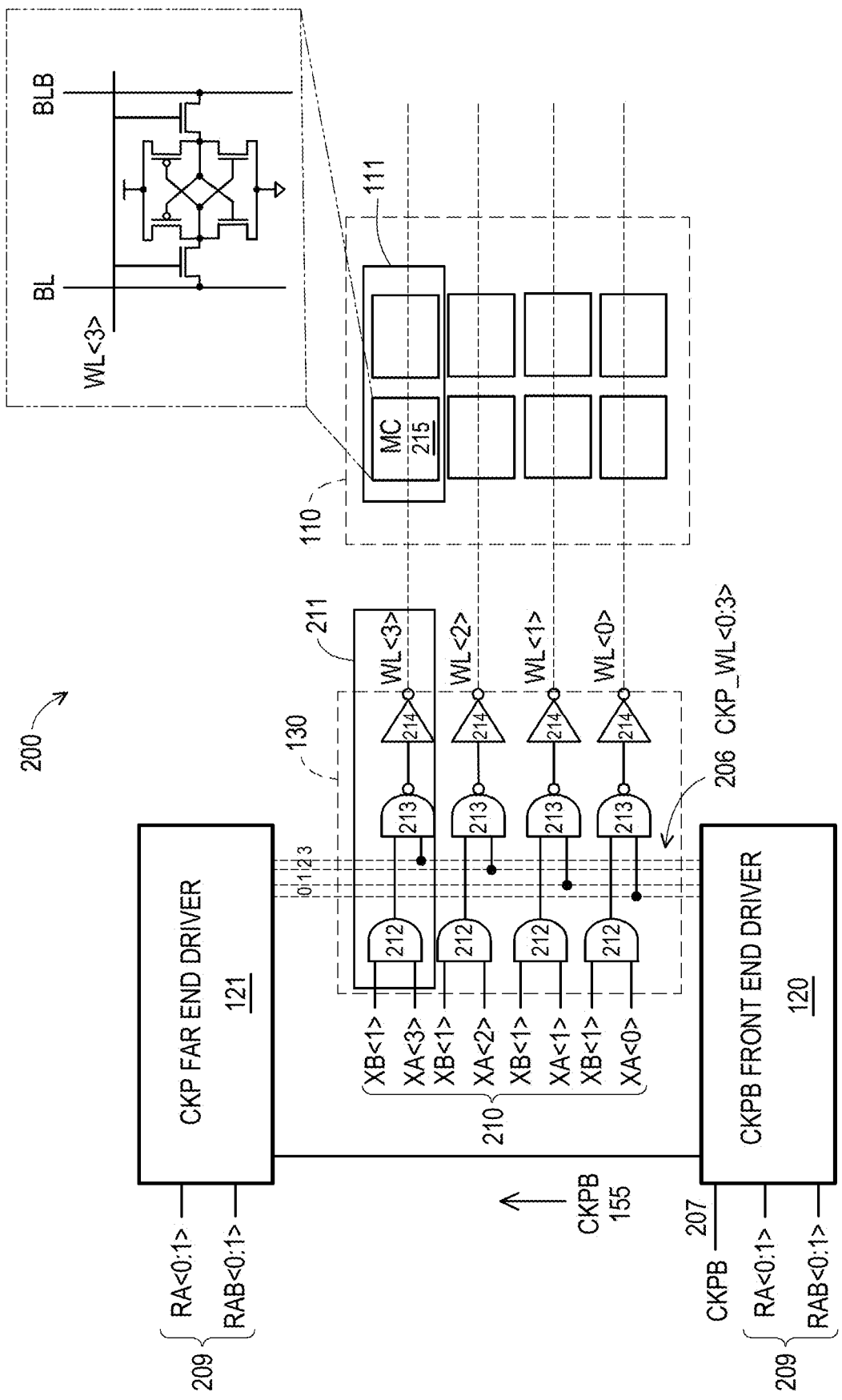
FIG. 2 is a circuit diagram depicting an array of memory cells of a memory device with two memory clock drivers disposed opposite each other and example local control circuitry for selecting a row of memory cells, in accordance with some embodiments.

FIG. 2 is a circuit diagram 200 depicting an array of memory cells 110 of a memory device with two memory clock drivers 120, 121 disposed opposite each other and example row selection circuit 130 for selecting a row of memory cells 111, in accordance with some embodiments. The device depicted in FIG. 2 corresponds to a single array of memory cells 110 and the corresponding first and second memory clock drivers 120, 121 and row selection circuit 130 for selecting and driving a row of memory cells 111 of an array of memory cells 110 depicted in FIG. 1. A first memory clock driver 120 is disposed on a first side of the array of memory cells 110. A second memory clock driver 121 is disposed on a second side of the array of memory cells 110 opposite the first memory clock driver 120.

Both the first memory clock driver 120 and the second memory clock driver 121 are electrically coupled to a plurality of conductive word line clock signal lines ("WLCS lines") 206. In some embodiments, the number of WLCS lines in the plurality of WLCS lines 206 corresponds to a number of rows of memory cells 111. Each WLCS line of the plurality of WLCS lines 206 is electrically coupled at a first end to the first memory clock driver 120 to receive an output of the first memory clock driver 120 and electrically coupled at a second end to the second memory clock driver 121 to receive a corresponding output of the second memory clock driver 121 such that the outputs of both memory clock drivers 120, 121 provide the same signal to the WLCS line given the same input values to both memory clock drivers 120, 121.

In some embodiments, a master clock signal 207 is received as an input to the first memory clock driver 120 and sent by the first memory clock driver 120 to the second memory clock driver 121 at 155. Both the first memory clock driver 120 and the second memory clock driver 121 receive an address 209 corresponding to a row of memory cells 111 in the array of memory cells 110 to be activated. In some embodiments, the address 209 has n/2 bits, where n is the number of rows of memory cells in the array of memory cells 110.

Upon receiving the address 209 corresponding to a row of memory cells in the array of memory cells 110, the first memory clock driver 120 and the second memory clock driver 121 decode the address 209 and activate a WLCS line in the WLCS lines 206 that corresponds to the address 209 and the row of memory cells in the array of memory cells 110 to be activated. The activation of the WLCS line in the WLCS lines 206 occurs timed to the clock signal 207. The activated WLCS line in the WLCS lines 206 is driven at both ends by both the first memory clock driver 120 and the second memory clock driver 121.

The WLCS lines 206 are received as inputs by the row selection circuit 130. The row selection circuit 130 also receives a row select address 210 as an input corresponding to the row of memory cells 111 in the array of memory cells 110 to be selected. In some embodiments, the row select address 210 consists of a thermometer code with n*2 bits, where n is the number of rows of memory cells 111 in the array of memory cells 110. In some embodiments, two bits of the address 210 correspond to each row of memory cells 111 in the array of memory cells 110.

In some embodiments, the row selection circuit 130 contains a row selection circuit 211 corresponding to each row of memory cells 111 in the array of memory cells 110. In embodiments, the row selection circuit 211 comprises multiple stages. The row selection circuit 211 contains a first stage 212 consisting of a logic AND gate receiving the row select address 210 as an input. The output of the first stage 212 is received by a second stage 213 consisting of a logic NAND gate, which also receives a WLCS line corresponding to the row of memory cells 111 of the array of memory cells 110 corresponding to the row selection circuit 211. A third stage 214 of the row selection circuit 211 consists of a logic NOT gate receiving an output of the second stage 213 as an input. An output of the third stage 214 is electrically coupled to the row of memory cells of the array of memory cells corresponding to the row selection circuit 211.

Upon receiving two logic high bits of the address 210 at the first stage 212, the first stage outputs a logic high signal, which is received by the second stage 213 NAND gate. When the second stage 213 receives a logic high signal from the first stage and a high signal on the corresponding WLCS line of the WLCS lines 206, the second stage 213 outputs a logic low signal. Upon receiving a logic low signal from the second stage 213 at the third stage 214, the third stage 214 outputs a logic high signal, which activates the corresponding row of memory cells 111 of the array of memory cells 110. A variety of memory cell types (e.g., static random access memory (SRAM) cells, dynamic random access memory (DRAM) cells, etc.) may be used to implement a memory cell 215 of the array of memory cells 110.

Figure 3:
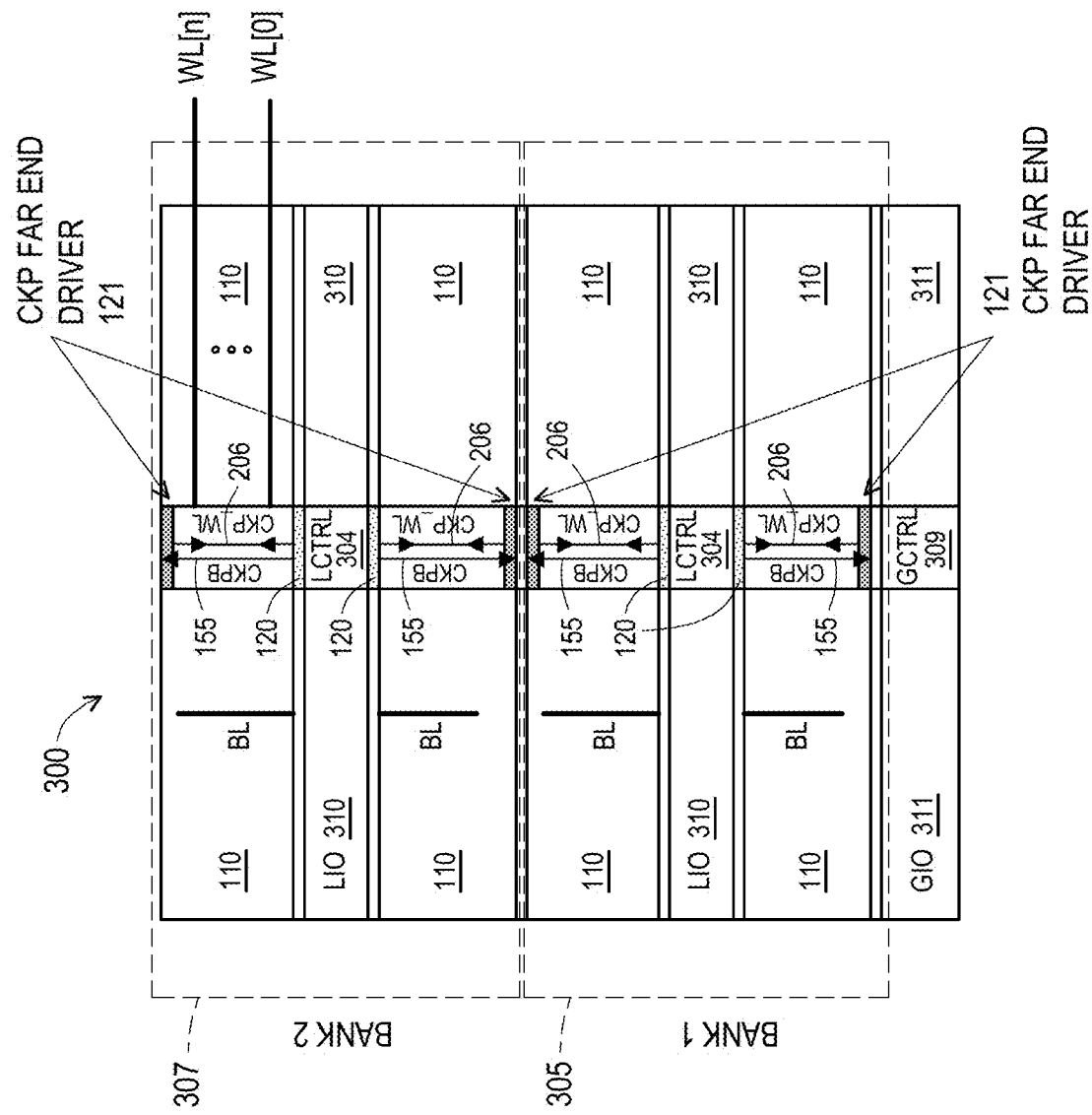
FIG. 3 is a block diagram depicting a layout of a memory device including multiple arrays of memory cells with two memory clock drivers disposed opposite each other and associated control devices, in accordance with some embodiments.

FIG. 3 is a block diagram depicting a layout of a memory device 300 including multiple arrays of memory cells 110 with two memory clock drivers 120, 121 disposed opposite each other and associated control devices, in accordance with some embodiments. The memory device 300 includes multiple arrays of memory cells 110, in accordance with some embodiments. Each of the arrays of memory cells 110 includes a plurality of memory cells (e.g., static random access memory (SRAM) cells, dynamic random access memory (DRAM) cells, etc.) arranged in rows and columns.

Word lines WL[0]-[n] select rows of the respective arrays of memory cells 110. A first memory clock driver 120 is disposed on a first side of each array of memory cells 110 and a second memory clock driver 121 is disposed on an opposite side of each array of memory cells 110. The first memory clock driver 120 is electrically coupled to a first end of a plurality of conductive lines 206 and the second memory clock driver 121 is electrically coupled to a second end of the plurality of conductive lines 206, which act as the WLCS lines 206 in FIG. 2. The plurality of conductive lines 206 comprises one line corresponding to each row of memory cells in the array of memory cells 110 and drives the corresponding word lines WL[0]-[n] for each row of memory cells. In some embodiments, the first memory clock driver 120 transmits a master clock signal 155 to the second memory clock driver 121. In some embodiments, the memory clock drivers 120, 121 are disposed between two arrays of memory cells 110.

In some embodiments, the memory device 300 contains multiple banks of memory cell arrays 305, 307, with each bank of memory cell arrays 305, 307 containing a plurality of arrays of memory cells 110. In embodiments, each bank of memory cell arrays 305, 307 is controlled by a local control circuit 304, which includes control circuitry configured to control operation of the memory clock drivers 120, 121. In embodiments, a global control circuit 309 controls the entire memory device 300 by generating and sending signals to the local control circuits 304 to perform requested operations. The local control circuits 304 then generates other signals based on the signals received from the global control circuitry 309 to perform requested operations, which it transmits to the memory clock drivers 120, 121. For example, based on signals received from the global control circuit 309, the local control 304 generates signals to activate certain memory clock drivers 120, 121 coupled to one of the arrays of memory cells 110. Further, in embodiments, based on signals received from the global control 309, the local control 304 generates signals sent to local input/outputs (IOs) 310.

The global control circuit 309 is the main control block of the memory device 300, in embodiments. The global control circuit 309 uses control inputs received from the outside world (e.g., chip-level inputs) and generates appropriate internal signals to perform requested operations. In embodiments, global IOs 311 are disposed alongside the global control circuit 309 and near the boundary of the memory device 300, as illustrated in FIG. 3. The global I/Os 311 are coupled to the outside world, allowing a device (e.g., a processor, chip, etc.) to read from the memory device 300 and/or write to the memory device 300. Thus, in reading data from the memory device 300, data is read from the arrays of memory cells 110 and transmitted to one or more of the global I/Os 311, enabling the data to be received by the device. Likewise, in writing data to the memory device 300, the device transmits the data to one or more of the global I/Os 311, enabling this data to be written to the arrays of memory cells 110.

In the memory device 300 including multiple arrays of memory cells 110, as in FIG. 3, the local IOs 310 are disposed alongside the local control 304. The local IOs 310 interface with bitlines from adjacent arrays of memory cells 110 disposed above and below the local IOs 310. Further, the local IOs 310 operate on control signals from the local control 304 and perform appropriate operations on selected bitlines (e.g., read or write data). The local IOs 310 also interface with global IOs 311. Specifically, in embodiments, the local IOs 310 (i) receive data to write from the global IOs 311, and (ii) send data read from the arrays of memory cells 110 to the global IOs 311.

Figure 4:
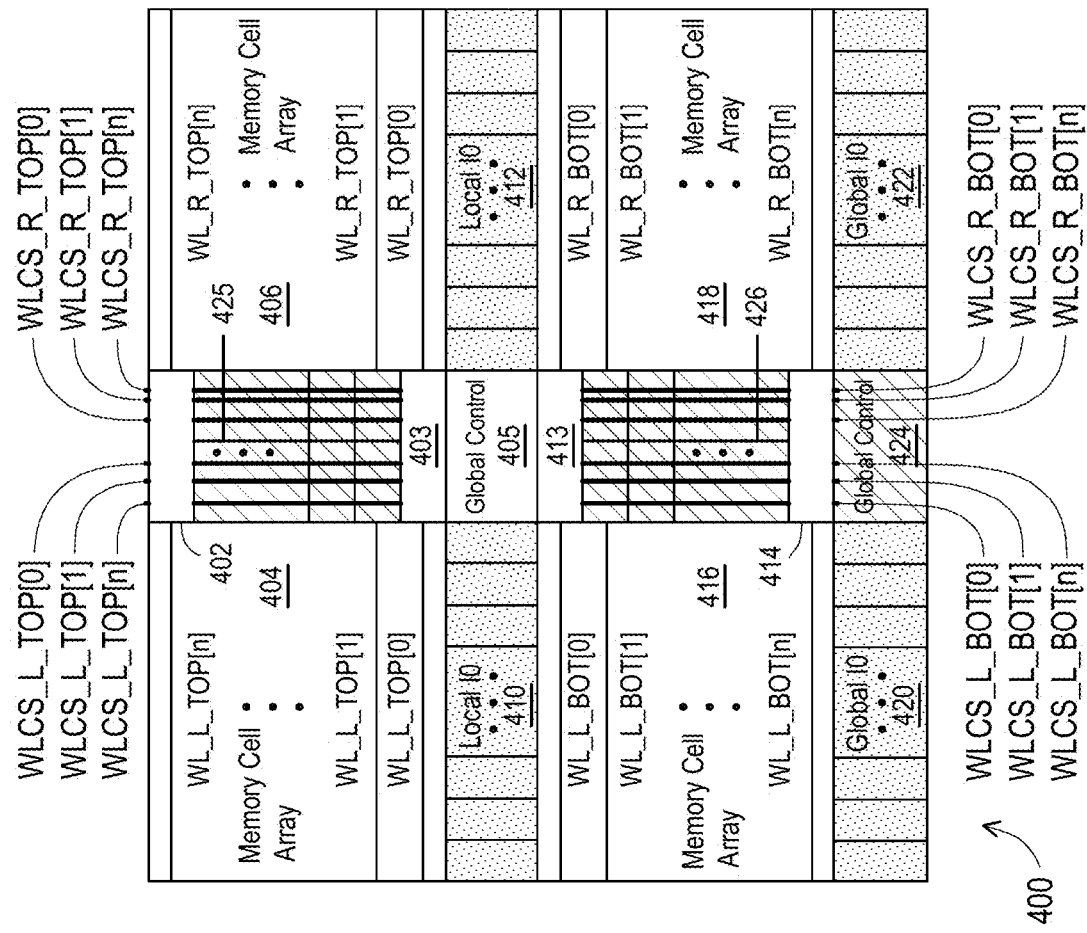
FIG. 4 is a block diagram depicting a layout of a memory device including multiple arrays of memory cells with two memory clock drivers disposed opposite each other and associated control devices with a number of signal lines, in accordance with some embodiments.

FIG. 4 is a block diagram depicting a layout of a memory device 400 including multiple arrays of memory cells 404, 406, 416, 418 with two memory clock drivers disposed opposite each other for each array of memory cells 402, 403 and 413, 414 and associated control devices with a number of signal lines, in accordance with some embodiments.

The memory device 400 includes a first word-line driver 403 and a second memory clock driver 402 disposed between first and second arrays of memory cells 404, 406. Each of the arrays of memory cells 404, 406 includes a plurality of memory cells (e.g., static random access memory (SRAM) cells, dynamic random access memory (DRAM) cells, etc.) arranged in rows and columns. Word lines WL_L_TOP[0]-[n] and WL_R_TOP[0]-[n] select rows of the respective arrays 404, 406, and bit lines (not illustrated in FIG. 4) select columns.

The first memory clock driver 403 and the second memory clock driver 402 are coupled to a first and a second end of conductive lines WLCS_L_TOP[0]-[n] and WLCS_R_TOP[0]-[n], which are configured to drive the word lines WL_L_TOP[0]-[n] and WL_R_TOP[0]-[n] to which they are coupled, respectively. The first memory clock driver 403 and the second memory clock driver 402 are also electrically coupled to a conductive line 425 carrying a master clock signal. A local control circuit 405 (also described above with reference to FIG. 3) includes control circuitry configured to control operation of the first memory clock driver 403 and the second memory clock driver 402.

The memory device 400 further includes a second memory clock driver pair comprising a third memory clock driver 414 and a fourth memory clock driver 413 disposed between third and fourth arrays of memory cells 416, 418. Word lines WL_L_BOT[0]-[n] and WL_R_BOT[0]-[n] select rows of the respective arrays 416, 418. The third memory clock driver 414 and the fourth memory clock driver 413 are coupled to a first and a second end of conductive lines WLCS_L_BOT[0]-[n] and WLCS_R_BOT[0]-[n], which are configured to drive the word lines WL_L_BOT[0]-[n] and WL_R_BOT[0]-[n] to which they are coupled. The third memory clock driver 414 and the fourth memory clock driver 413 are also electrically coupled to a conductive line 425 carrying a master clock signal. The local control circuit 405 controls operation of the third word-line driver 414 and the fourth memory clock driver 413 in a manner similar to its control of the first word-line driver 403 and the second memory clock driver 402.

A global control 424 is the main control block of the memory device 400, in embodiments. The global control 424 uses control inputs received from the outside world (e.g., chip-level inputs) and generates appropriate internal signals to perform requested operations. In embodiments, the IOs 420, 422 are disposed alongside the global control circuit 424 and near the boundary of the memory device 400, as illustrated in FIG. 4. The global I/Os 420, 422 are coupled to the outside world, allowing a device (e.g., a processor, chip, etc.) to read from the memory device 400 and/or write to the memory device 400. Thus, in reading data from the memory device 400, data is read from the arrays of memory cells 404, 406, 416, 418 and transmitted to one or more of the global I/Os 420, 422, enabling the data to be received by the device. Likewise, in writing data to the memory device 400, the device transmits the data to one or more of the global I/Os 420, 422, enabling this data to be written to the arrays of memory cells 404, 406, 416, 418. In embodiments, there is one global IO block for each bit of the memory's word size.

The local control circuit 405 and local IOs 410, 412 are present in the memory device including multiple arrays of memory cells 404, 406, 416, 418, as in the example of FIG. 4. The local control circuit 405 includes circuitry that operates on signals received from the global control circuit 424 and generates other signals to perform requested operations. For example, based on signals received from the global control 424, the local control circuit 405 generates signals to activate a certain word-line driver coupled to one of the arrays 404, 406, 416, 418. Further, in embodiments, based on signals received from the global control circuit 424, the local control circuit 405 generates signals sent to the local IOs 410, 412.

In a memory device including multiple arrays of memory cells 404, 406, 416, 418, as in FIG. 4, the local IOs 410, 412 are disposed alongside the local control circuit 405. The local IOs 410, 412 interface with bitlines from both the upper memory cell arrays 404, 406 and the lower memory cell arrays 416, 418. Further, the local IOs 410, 412 operate on control signals from the local control circuit 405 and perform appropriate operations on selected bitlines (e.g., read or write data). The local IOs 410, 412 also interface with the global IOs 420, 422. Specifically, in embodiments, the local IOs 410, 412 (i) receive data to write from the global IOs 420, 422, and (ii) send data read from the arrays of memory cells 404, 406, 416, 418 to the global IOs 420, 422.

Figure 5:
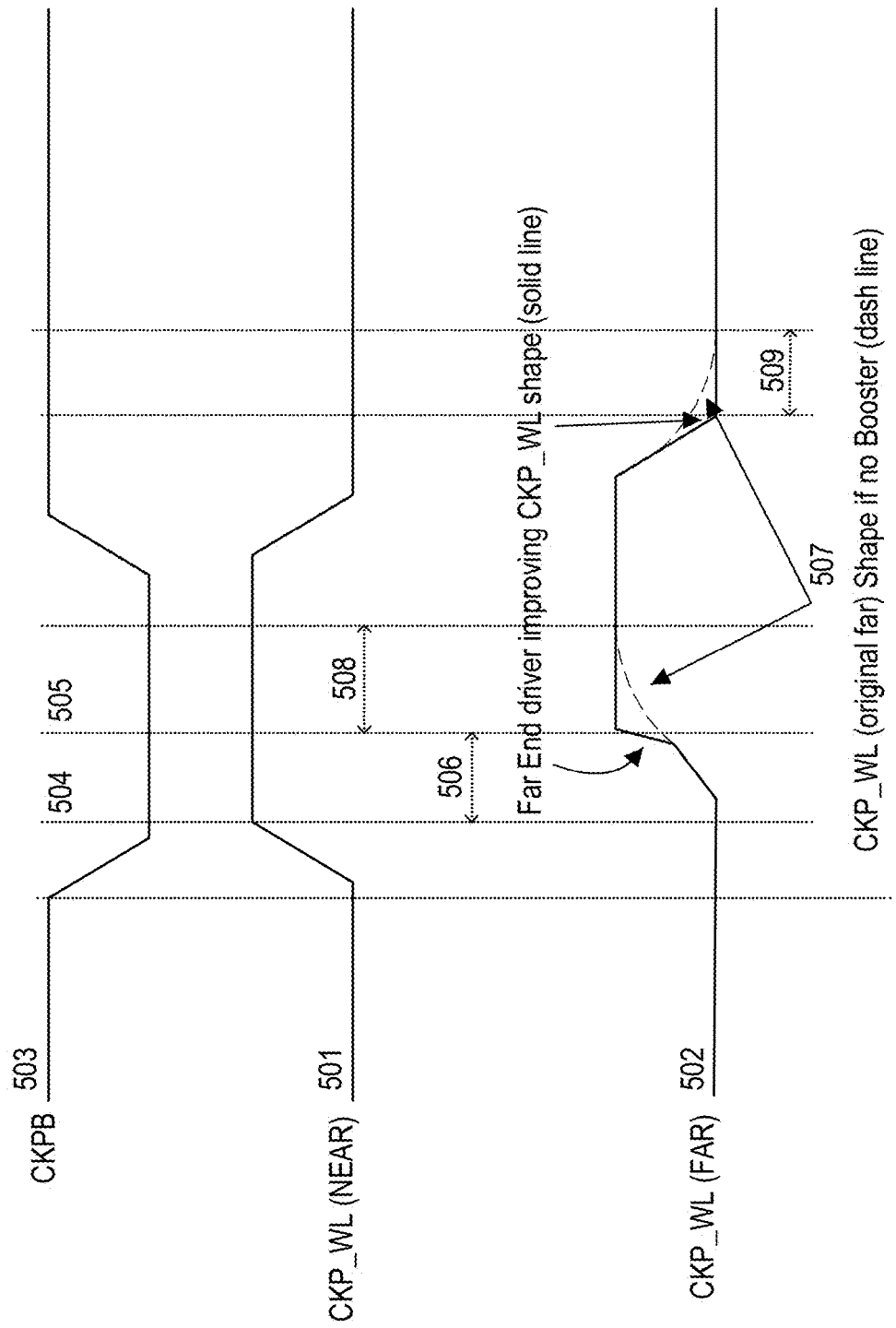
FIG. 5 is a timing diagram depicting signals at two ends of a memory clock signal line of the array of memory cells of FIG. 2 in the time domain, in accordance with some embodiments.

FIG. 5 is a timing diagram 500 depicting signals 501, 502 at two ends of a WLCS line of the array of memory cells of FIG. 2 in the time domain, in accordance with some embodiments. After receiving and decoding an address, a first and a second memory clock driver activate a WLCS line corresponding to the address upon a change in a master clock signal 503. Because the clock signal reaches the first memory clock driver before being transmitted to the second memory clock driver in FIG. 2, a signal on a first end of the WLCS line 501 is driven to a high voltage at time 504 by the first memory clock driver after a short propagation delay. A second end of the WLCS line is driven to a high voltage at time 505, after a longer propagation delay due to the clock signal first being received and sent by the first memory clock driver to the second memory clock driver in FIG. 2. Therefore, the second end of the WLCS line is driven to a high voltage at a time 505 delayed by an additional propagation delay of 506.

Implementation of a second memory clock driver results in a voltage signal on the second end of the WLCS line represented by the solid line of 502. The dotted line 507 represents the voltage signal on the second end of the WLCS line if a second memory clock driver were not implemented in the memory device. As depicted in FIG. 5, implementation of the second memory clock driver results in the voltage signal on the second end of the WLCS line being driven to its high voltage state more quickly than if it were not used by the time represented by 508. The slower rise of voltage at the second end of the WLCS line when a second memory clock driver is not used is caused by a timing contamination delay across the WLCS line after being driven by the first memory clock driver. Implementation of the second memory clock driver eliminates the timing contamination delay and in some embodiments, reduces propagation delay between the signal at the first end of the WLCS line 501 and the second end of the WLCS line by 5%.

Similarly, the voltage drops more quickly by a time represented as 509 in FIG. 5. Without implementation of the second memory clock driver, the voltage drops more slowly than if it is driven low by the second memory clock driver because of the propagation delay for charge to drain from the second end of the WLCS line through the first memory clock driver.

Figure 6:
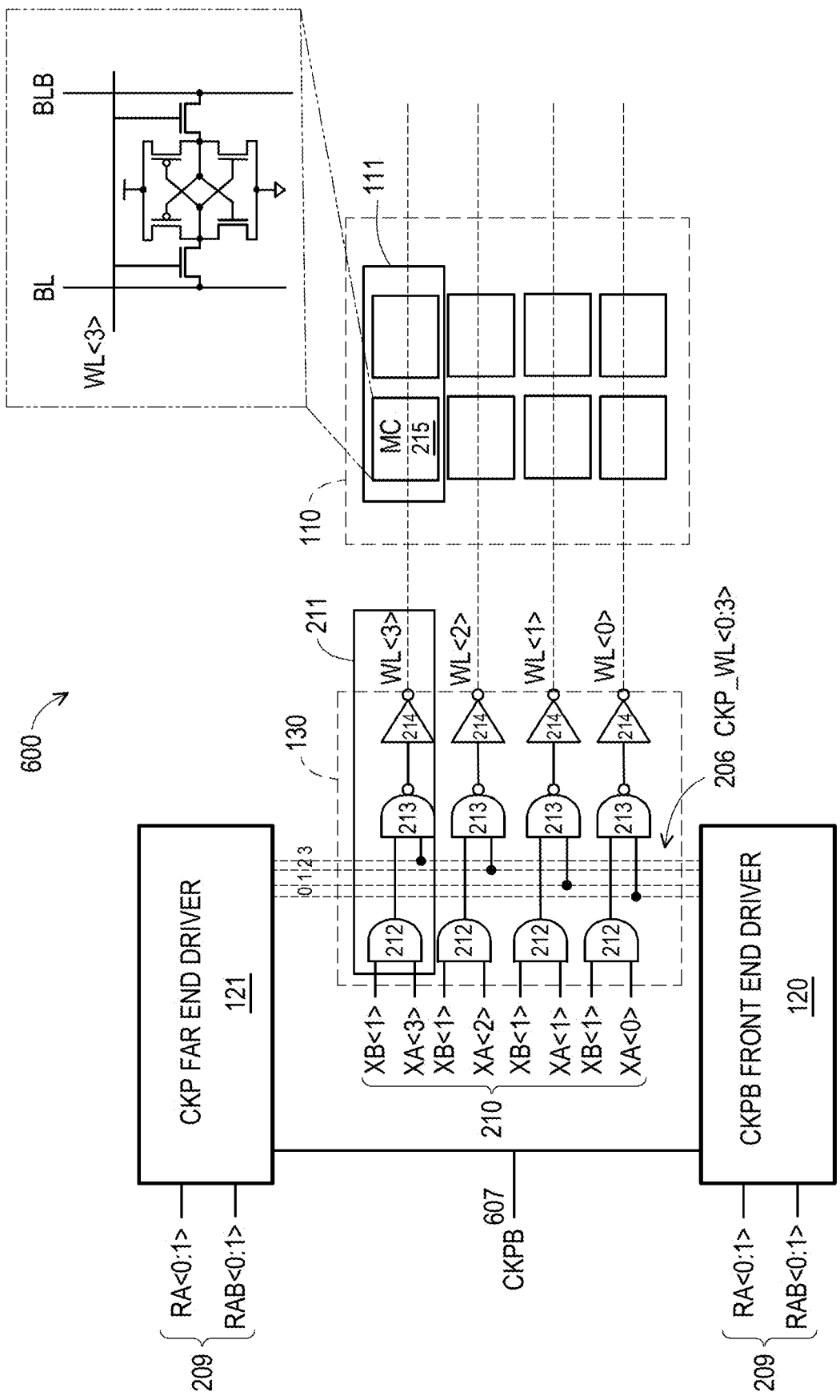
FIG. 6 is a circuit diagram depicting an array of memory cells of a memory device with two memory clock drivers disposed opposite each other and circuitry for selecting a row, in which both memory clock drivers are electrically coupled directly to a word line clock signal line, in accordance with some embodiments.

FIG. 6 is a circuit diagram depicting an array of memory cells 110 of a memory device 600 with two memory clock drivers 120, 121 disposed opposite each other and circuitry for selecting a row 130, in which both memory clock drivers 120, 121 are electrically coupled directly to a master clock signal line 607, in accordance with some embodiments. The memory device 600 is identical to the memory device 200 of FIG. 2, except for the clock signal line 607 being directly coupled to both memory clock drivers 120 and 121.

A first memory clock driver 120 is disposed on a first side of the array of memory cells 110. A second memory clock driver 121 is disposed on a second side of the array of memory cells 110 opposite the first memory clock driver 120. Both the first memory clock driver 120 and the second memory clock driver 121 are electrically coupled to a plurality of conductive WLCS lines 206. In some embodiments, the number of WLCS lines in the plurality of WLCS lines 206 corresponds to a number of rows of memory cells 111. Each WLCS line of the plurality of WLCS lines 206 is electrically coupled at a first end to the first memory clock driver 120 to receive an output of the first memory clock driver 120 and electrically coupled at a second end to the second memory clock driver 121 to receive a corresponding output of the second memory clock driver 121 such that the outputs of both memory clock drivers 120, 121 provide the same signal to the WLCS line given the same input values to both memory clock drivers 120, 121.

In some embodiments, a master clock signal 607 is received as an input to both the first memory clock driver 120 and the second memory clock driver 121 simultaneously. Both the first memory clock driver 120 and the second memory clock driver 121 receive an address 209 corresponding to a row of memory cells in the array of memory cells 110 to be activated. In some embodiments, the address 209 has n/2 bits, where n is the number of rows of memory cells in the array of memory cells 110.

Upon receiving the address 209 corresponding to a row of memory cells in the array of memory cells 110, the first memory clock driver 120 and the second memory clock driver 121 decode the address 209 and activate a WLCS line in the WLCS lines 206 that corresponds to the address 209 and the row of memory cells in the array of memory cells 110 to be activated. The activation of the WLCS line in the WLCS lines 206 occurs timed to the clock signal 607. The activated WLCS line in the WLCS lines 206 is driven at both ends by both the first memory clock driver 120 and the second memory clock driver 121.

The WLCS lines 206 are received as inputs by the row selection circuit 130. The row selection circuit 130 also receives a row select address 210 as an input corresponding to the row of memory cells in the array of memory cells 110 to be selected. In some embodiments, the row select address 210 consists of a thermometer code with n*2 bits, where n is the number of rows of memory cells in the array of memory cells 110. In some embodiments, two bits of the address 210 correspond to each row of memory cells in the array of memory cells 110.

In some embodiments, the row selection circuit 130 contains a row selection circuit 211 corresponding to each row of memory cells in the array of memory cells 110. In embodiments, the row selection circuit 211 comprises multiple stages. The row selection circuit 211 contains a first stage 612 consisting of a logic AND gate receiving the row select address 210 as an input. The output of the first stage 612 is received by a second stage 613 consisting of a logic NAND gate, which also receives a WLCS line corresponding to the row of memory cells of the array of memory cells 110 corresponding to the row selection circuit 211. A third stage 614 of the row selection circuit 211 consists of a logic NOT gate receiving an output of the second stage 613 as an input. An output of the third stage 614 is electrically coupled to the row of memory cells of the array of memory cells corresponding to the row selection circuit 211.

Upon receiving two logic high bits of the address 210 at the first stage 612, the first stage outputs a logic high signal, which is received by the second stage 613 NAND gate. When the second stage 613 receives a logic high signal from the first stage and a high signal on the corresponding WLCS line of the WLCS lines 206, the second stage 613 outputs a logic low signal. Upon receiving a logic low signal from the second stage 613 at the third stage 614, the third stage 614 outputs a logic high signal, which activates the corresponding row of memory cells of the array of memory cells 2110.

A variety of memory cell types (e.g., static random access memory (SRAM) cells, dynamic random access memory (DRAM) cells, etc.) may be used to implement a memory cell 615 of the array of memory cells 110.

Figure 7:
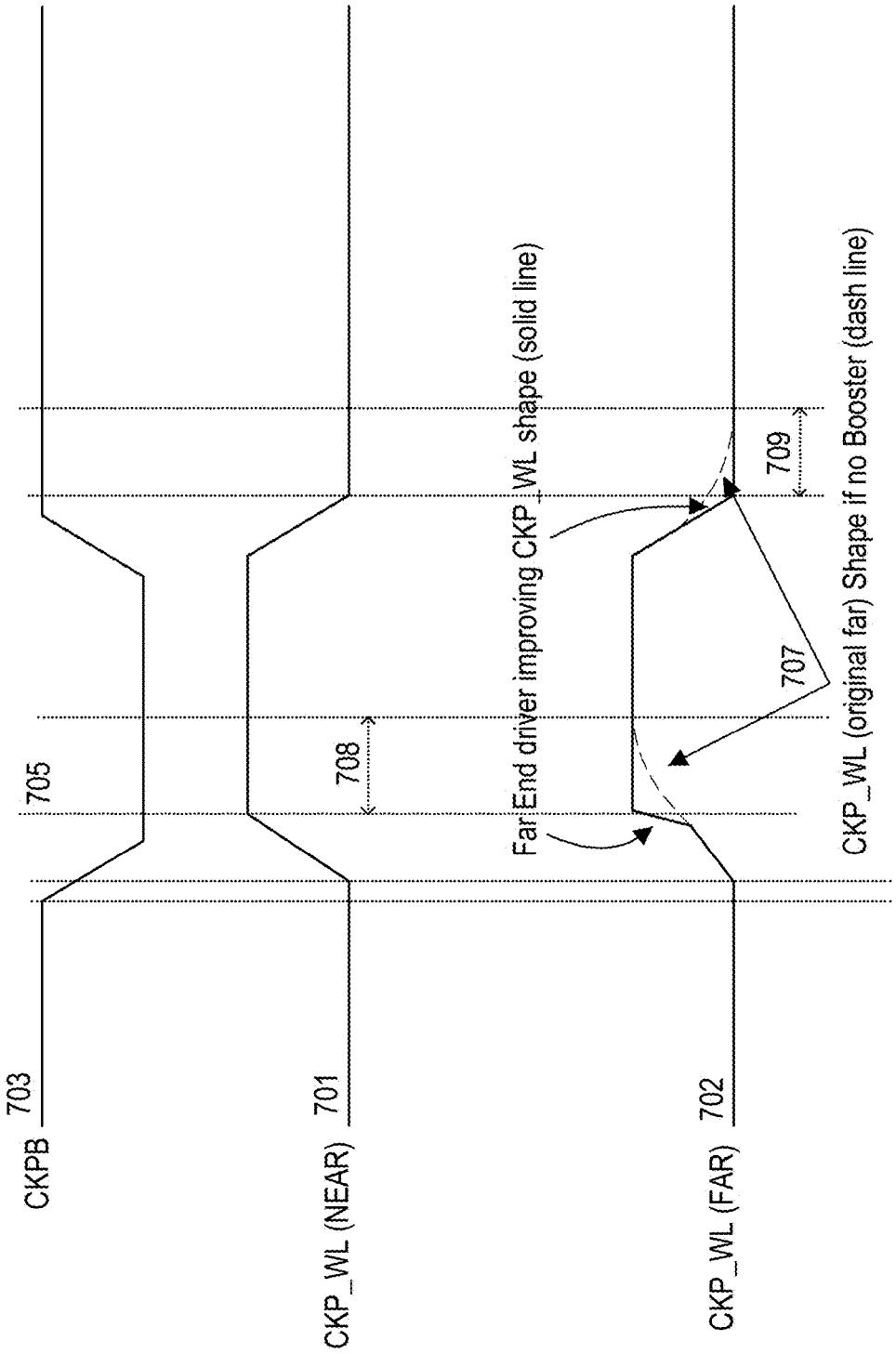
FIG. 7 is a timing diagram depicting signals at two ends of a memory clock signal line of the array of memory cells of FIG. 6 in the time domain, in accordance with some embodiments.

FIG. 7 is a timing diagram 700 depicting signals 701, 702 at two ends of a WLCS line of the array of memory cells of FIG. 6 in the time domain, in accordance with some embodiments. After receiving and decoding an address, a first and a second memory clock driver activate a WLCS line corresponding to the address upon a change in a master clock signal 703. Because the clock signal 703 reaches the first memory clock driver and the second memory clock driver at the same time, the propagation delay depicted in FIG. 5 as 506 is eliminated. A signal on a first end of the WLCS line 701 is driven to a high voltage at time 705 by the first memory clock driver at the same time as a signal on a second end of the WLCS line 702 is driven high by the second memory clock driver.

Implementation of a second memory clock driver results in a voltage signal on the second end of the WLCS line represented by the solid line of 702. The dotted line 707 represents the voltage signal on the second end of the WLCS line if a second memory clock driver were not implemented in the memory device. As depicted in FIG. 7, implementation of the second memory clock driver results in the voltage signal on the second end of the WLCS line being driven to its high voltage state more quickly than if it were not used by the time represented by 708. The slower rise of voltage at the second end of the WLCS line when a second memory clock driver is not used is caused by a timing contamination delay across the WLCS line after being driven by the first memory clock driver. Implementation of the second memory clock driver eliminates the timing contamination delay and in some embodiments, reduces propagation delay between the signal at the first end of the WLCS line 701 and the second end of the WLCS line by 5%.

Similarly, the voltage drops more quickly by a time represented as 709 in FIG. 7. Without implementation of the second memory clock driver, the voltage drops more slowly than if it is driven low by the second memory clock driver because of the propagation delay for charge to drain from the second end of the WLCS line through the first memory clock driver.

Figure 8:
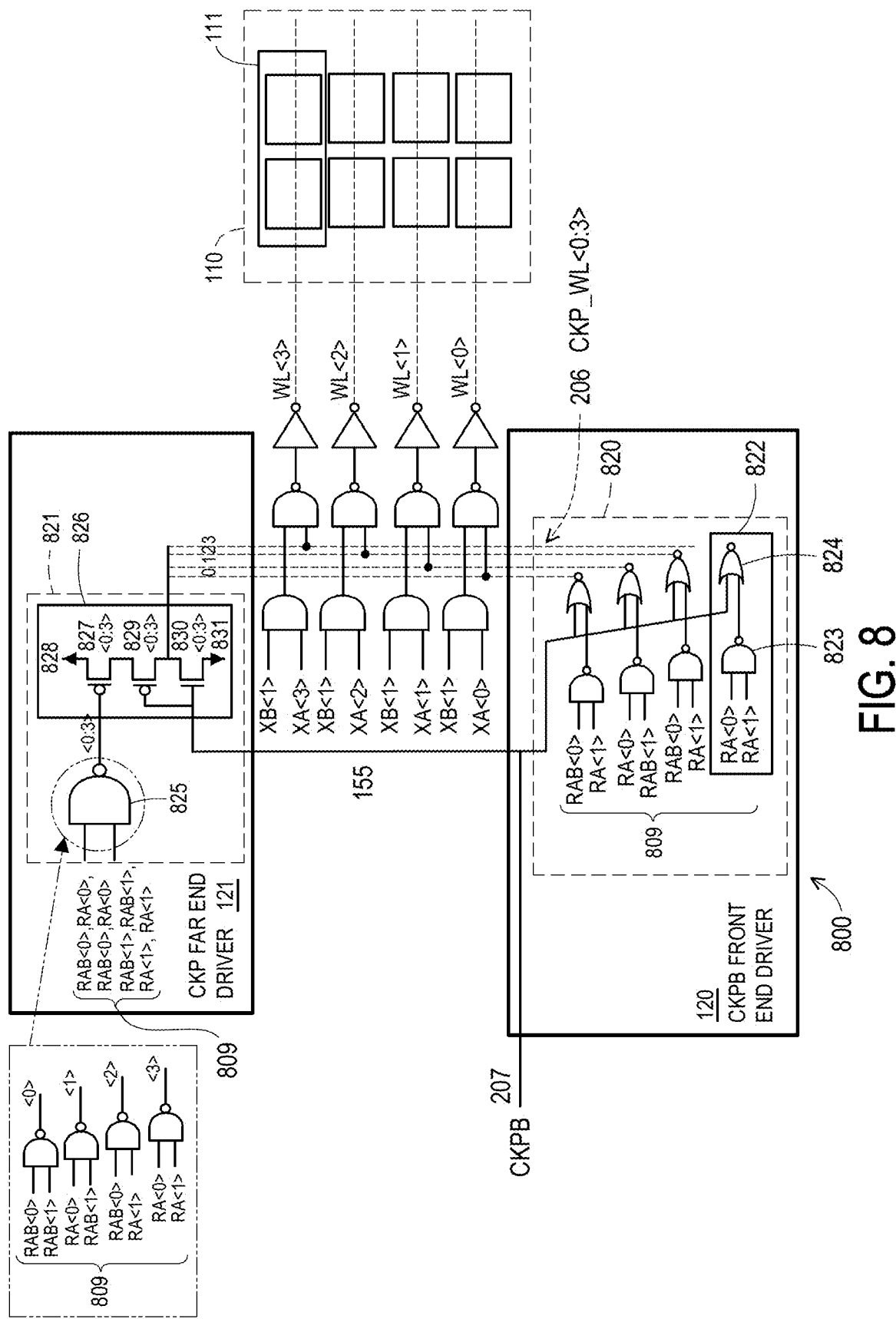
FIG. 8 is a circuit diagram depicting the array of memory cells of FIG. 2 including example circuitry for a memory clock driver implementation, in accordance with some embodiments.

FIG. 8 is a circuit diagram depicting the array of memory cells of FIG. 2 including example circuitry for a memory clock driver implementation, in accordance with some embodiments. A first memory clock driver 120 and a second memory clock driver 121 each contain a decoder 820, 821, which accepts an address 809 of a row of memory cells 111 in an array of memory cells 110 to be activated as an input and decodes the address to activate a WLCS line 206 corresponding to a row of memory cells 111 to be activated.

The decoder 820 contains a two stage decoding circuit 822 corresponding to each row of memory cells 111. In some embodiments, the two stage decoding circuit 822 contains a first stage 823 of a logic NAND gate, which receives two bits of the address 809 as an input. The first stage 823 outputs a signal as an input to a second stage 824 logic NOR gate. The second stage 824 receives a master clock signal 207 as a second input and has an output electrically coupled to a WLCS line 206 corresponding to a row of memory cells 111.

When the first stage 823 logic NAND gate receives two logic high bits, the first stage 823 outputs a logic low signal to the second stage 824 NOR gate, which also receives the clock signal 207. When the second stage 824 receives a logic low signal from the first stage and the clock signal 207 goes low, the decoding circuit 822 drives the corresponding WLCS line 206 high.

In some embodiments, a two stage decoding circuit 821 corresponding to each row of memory cells 111. The two stage decoding circuit 821 contains a first stage 825 comprising a logic NAND gate receiving two bits of the address 809 as an input. The first stage 825 outputs a signal to an output stage 826 of the memory clock driver 121. The output stage 826 contains a first transistor 827 with a first terminal electrically coupled to a voltage source 828, a second terminal electrically coupled to a first terminal of a second transistor 829, and a gate voltage electrically coupled to an inverted output of the first stage 825. The second transistor 829 has a second terminal electrically coupled to the WLCS line 206 corresponding to a row of memory cells 111 and a first terminal of a third transistor 830. The second transistor 829 also has a gate electrically coupled to an inverted clock signal 207. The third transistor 830 has a second terminal electrically coupled to electrical ground 831 and a gate terminal electrically coupled to the clock signal 207. The two stage decoding circuit 821 is logically equivalent to the two stage decoding circuit 822.

Figure 9:
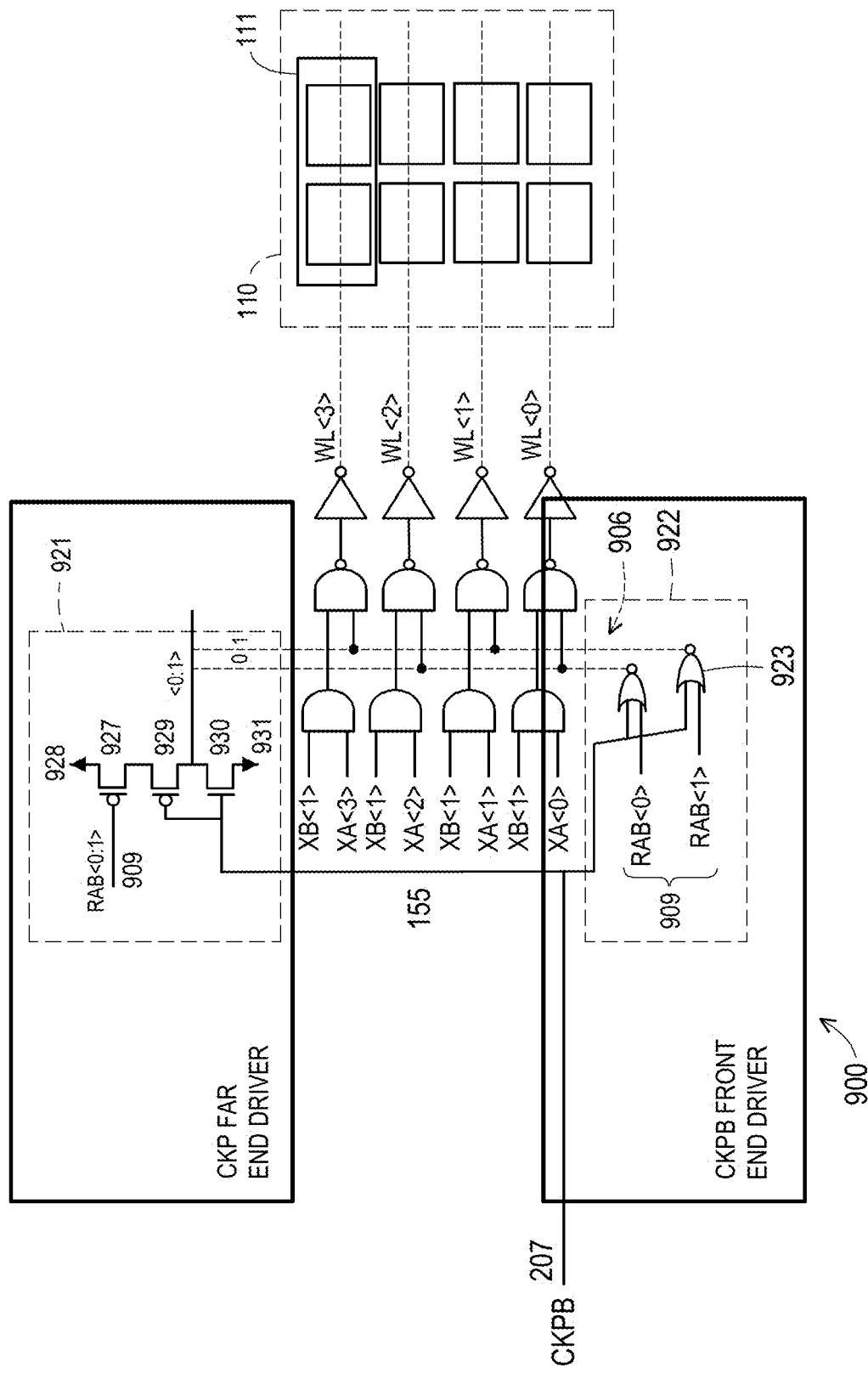
FIG. 9 is a circuit diagram depicting an array of memory cells including example circuitry for a memory clock driver implementation, in accordance with some embodiments.

FIG. 9 is a circuit diagram 900 depicting an array of memory cells 110 including example circuitry for a memory clock driver implementation, in accordance with some embodiments. In some embodiments, a decoder circuit 922 comprises NOR gates 923. Each NOR gate 923 corresponds to one or more rows of memory cells 111 and is electrically coupled to a WLCS line 906 corresponding to the one or more rows of memory cells 111. Each of the NOR gates 923 receives a single bit of an address 909 corresponding to a row of memory cells 111 of the array of memory cells 110 and a master clock signal 207 as inputs. The NOR gates 923 drive the WLCS line high when the single digit of the address 909 is a logic low and the clock signal 207 goes low.

In some embodiments, a decoding circuit 921 corresponding to one or more rows of memory cells 111. The decoding circuit 921 contains a first transistor 927 with a first terminal electrically coupled to a voltage source 928, a second terminal electrically coupled to a first terminal of a second transistor 929, and a gate voltage electrically coupled to a digit of the address 909. The second transistor 929 has a second terminal electrically coupled to the WLCS line 906 corresponding to a row of memory cells 111 and a first terminal of a third transistor 930. The second transistor 929 also has a gate electrically coupled to an inverted clock signal 207. The third transistor 930 has a second terminal electrically coupled to electrical ground 931 and a gate terminal electrically coupled to the clock signal 207. The decoding circuit 921 is logically equivalent to the decoding circuit 922.

Figure 10:
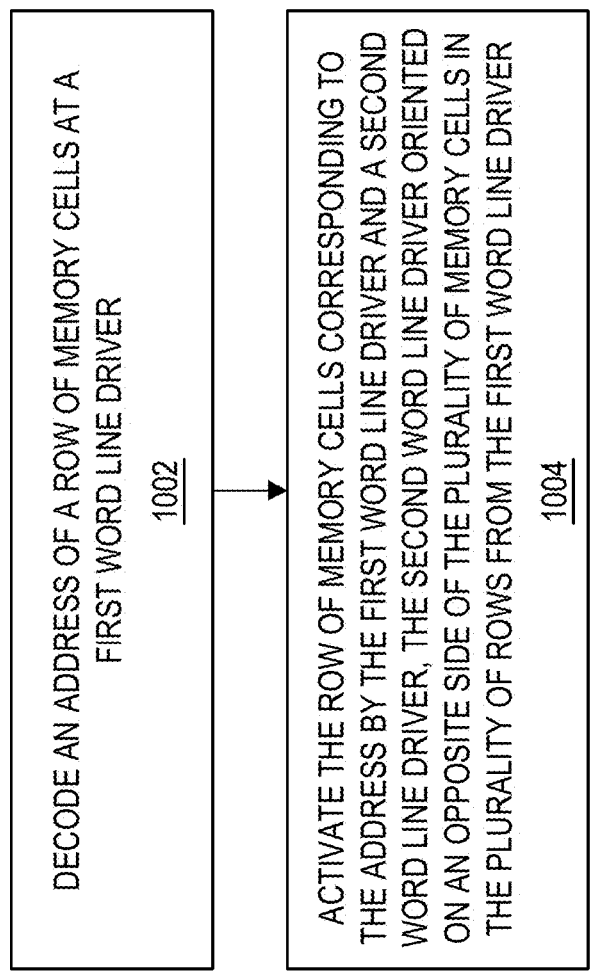
FIG. 10 is a flowchart depicting steps of an example method for operating a memory clock driver, in accordance with some embodiments.

FIG. 10 is a flowchart 1000 depicting steps of an example method for operating a word-line driver, in accordance with some embodiments. While the steps of the method may be performed using a wide variety of structures, references to some example structures are provided here for clarity. The method uses a first memory clock driver 120 to decode an address 209 of a row of memory cells 111 at 1002. At 1004, the first memory clock driver 120 and a second memory clock driver 121 activate the row of memory cells 111 corresponding to the address 209, wherein the second memory clock driver 121 is oriented on an opposite side of the plurality of memory cells 215 in the plurality of rows 111 from the first memory clock driver 120.

In one example, a memory device includes a plurality of memory cells in a plurality of rows, a first memory clock driver disposed on a first side of the plurality of rows, and a second memory clock driver disposed on a second side, opposite to the first side of the plurality of rows. The first and second memory clock drivers are configured to transmit a word line clock signal, in response to a master clock signal, to activate a row of memory cells in the plurality of rows using the first and the second memory clock drivers.

In another example, a method for operating a memory device uses a first memory clock driver to decode an address of a row of memory cells at a first memory clock driver. The first memory clock driver and a second memory clock driver are used to activate the row of memory cells corresponding to the address, where the second memory clock driver is oriented on an opposite side of the plurality of memory cells in the plurality of rows from the first memory clock driver.

In a further embodiment, a memory clock driver circuit coupled to an array of memory cells includes a first memory clock driver disposed on a first side of a plurality of rows of memory cells. A second memory clock driver is disposed on a second side, opposite to the first side of the plurality of rows. The first and second memory clock drivers are configured to transmit a word line clock signal, in response to a master clock signal, to activate a row of memory cells in the plurality of rows through a conductive line coupled between the first and second memory clock drivers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first memory clock driver disposed on a first side of a plurality of rows of a memory array, and
a second memory clock driver disposed on a second side of the plurality of rows of the memory array, and
a row selection circuit configured to select a row of memory cells in the plurality of rows of the memory array using an address of the row of memory cells, wherein the row selection circuit includes:
a first logical gate configured to receive the address;
a second logical gate coupled to an output of the first logic gate and configured to receive a word line clock signal from the first and second memory clock drivers; and
a third logical gate coupled between an output of the second logical gate and the row of memory cells in the plurality of rows of the memory array.

2. The memory device of claim 1, wherein:
the first memory clock driver comprises a first decoder; and
the second memory clock driver comprises a second decoder.

3. The memory device of claim 1, wherein the first memory clock driver is configured to receive a master clock signal and transmit the master clock signal to the second memory clock driver.

4. The memory device of claim 1, wherein the first memory clock driver and the second memory clock driver are both configured to receive a master clock signal concurrently.

5. The memory device of claim 2, wherein:
the first memory clock driver and the second memory clock driver are configured to receive an address corresponding to a row of memory cells in the plurality of rows,
the address being decoded by the first decoder and the second decoder to correspond to the row of memory cells in the plurality of rows,
wherein the first memory clock driver and the second memory clock driver are configured to transmit the word line clock signal, in response to a master clock signal, to activate the row of memory cells in the plurality of rows corresponding to the address through the conductive line coupled between the first and second memory clock drivers.

6. The memory device of claim 5, wherein:
the first logical gate is a logical AND gate;
the second logical gate is a logical NAND gate; and
the third logical gate is a logical NOT gate.

7. The memory device of claim 2, wherein each of the first and second decoders comprise a circuit corresponding to each row of memory cells in the plurality of rows comprising:
a logical NAND gate configured to receive two bits of the address as inputs; and
a logical NOR gate electrically coupled to an output of the logical NAND gate as a first input and a master clock signal as a second input, wherein the output of the logical NOR gate is a word line clock signal to activate the row of memory cells in the plurality of rows.

8. The memory device of claim 7, wherein the NOR gate is comprised of:
a first transistor having a first terminal electrically coupled to a voltage source and a gate terminal electrically coupled to the output of the logical NAND gate;
a second transistor having a first terminal electrically coupled to a second terminal of the first transistor and a gate terminal electrically coupled to the clock signal; and
a third transistor having a first terminal electrically coupled to a second terminal of the second transistor and the conductive line carrying the word line clock signal as an output of the decoder, a gate terminal electrically coupled to the clock signal, and a second terminal electrically coupled to an electrical ground.

9. The memory device of claim 2, wherein each of the first and second decoders comprise a circuit corresponding to each row of memory cells in the plurality of rows comprising a logical NOR gate electrically coupled to a master clock signal as a first input and a bit of the address as a second input, wherein the output of the logical NOR gate is the word line clock signal to activate the row of memory cells in the plurality of rows.

10. The memory device of claim 1, further comprising a local I/O, the local I/O being configured to transmit a master clock signal to one or more of the first and second memory clock drivers.

11. The memory device of claim 1, further comprising a clock signal generator, the clock signal generator electrically coupled to one or more of the first and second memory clock drivers, wherein the clock signal generator transmits a master clock signal to the one or more first and second memory clock drivers.

12. A method for operating a memory device comprising the step of:
activating a row of memory cells in a memory array corresponding to an address by a first memory clock driver and a second memory clock driver, the second memory clock driver oriented on an opposite side of the row of memory cells in the memory array from the first memory clock driver, wherein at least one of the first and second memory clock drivers includes a logical gate configured to receive the address and a master clock signal and to generate a word line clock signal that activates the row of memory cells using a conductive line coupled between the first and second memory clock drivers.

13. The method of claim 12, further comprising the first memory clock driver transmitting the master clock signal to the second memory clock driver.

14. The method of claim 12, wherein the master clock signal is received by the first memory clock driver and the second memory clock driver concurrently.

15. The method of claim 12, further comprising receiving a row select address at a row select circuit, wherein the row select circuit selects a row of memory cells corresponding to the row select address.

16. The method of claim 12, wherein the first memory clock driver transmits a decoded address corresponding to the row of memory cells to the second memory clock driver, the second memory clock driver activating the row of memory cells corresponding to the decoded address.

17. The method of claim 12, further comprising the second memory clock driver:
receiving the address corresponding to a row of memory cells;
decoding the address corresponding to the row of memory cells;
activating the row of memory cells corresponding to the address.

18. A memory clock driver circuit coupled to an array of memory cells, the memory clock driver circuit comprising:
a first memory clock driver disposed on a first side of a plurality of rows of memory cells, and
a second memory clock driver disposed on a second side of the plurality of rows,
wherein the first memory clock driver includes different components than the second memory clock drivers such that the second memory clock driver is configured to receive a master clock signal through the first memory clock driver, wherein the first memory clock driver and the second memory clock driver are configured to transmit a word line clock signal, in response to the master clock signal, using a conductive line coupled between the first and second memory clock drivers.

19. The memory clock driver circuit of claim 18, wherein:
the first memory clock driver and the second memory clock driver are configured to receive an address corresponding to a row of memory cells in the plurality of rows,
the address being decoded by the first memory clock driver and the second memory clock driver to correspond to the row of memory cells in the plurality of rows, and
the word line clock signal activates the row of memory cells in the plurality of rows corresponding to the address through the conductive line coupled between the first and second memory clock drivers.

20. The memory clock driver circuit of claim 18, wherein at least one of the first and second memory clock drivers includes a logical gate configured to receive an address of a row of memory cells in the plurality of row and the master clock signal and to generate a word line clock signal that activates the row of memory cells.

\* \* \* \* \*